United States Patent [19]
Viswanathan et al.

[11] Patent Number: 6,072,238
[45] Date of Patent: Jun. 6, 2000

[54] SEMICONDUCTOR COMPONENT

[75] Inventors: Lakshminarayan Viswanathan, Phoenix; David F. Abdo; Gerald R. Miller, both of Scottsdale, all of Ariz.

[73] Assignee: Motorola, Inc., Schaumburg, Ill.

[21] Appl. No.: 09/287,282

[22] Filed: Apr. 7, 1999

[51] Int. Cl.[7] .................................................. H01L 23/34
[52] U.S. Cl. ........................ 257/719; 257/718; 257/728
[58] Field of Search ................................... 257/718, 719, 257/726, 727, 728

[56] References Cited

U.S. PATENT DOCUMENTS

| | | |
|---|---|---|
| 3,831,131 | 8/1974 | Woodcock et al. . |
| 4,481,525 | 11/1984 | Calabro et al. . |
| 4,692,790 | 9/1987 | Oyamada et al. . |
| 4,837,664 | 6/1989 | Rodriguez, II et al. ................. 361/386 |
| 4,970,579 | 11/1990 | Arldt et al. . |
| 5,232,143 | 8/1993 | Buxton ..................................... 228/6.2 |
| 5,388,027 | 2/1995 | Pollock et al. ........................... 361/705 |
| 5,767,564 | 6/1998 | Kunimatsu et al. . |

*Primary Examiner*—Sheila V. Clark
*Attorney, Agent, or Firm*—Lanny L. Parker

[57] ABSTRACT

A semiconductor device (10) suitable for use in RF applications and a method of forming the semiconductor device (10). An RF transistor die (31) is bonded to a heatsink (21). The heatsink (21) having the semiconductor chip (31) mounted thereto is coupled to a printed circuit board (11), wherein the RF transistor die (31) extends through an opening (14) in the printed circuit board (11). Conductors (18, 19) on the printed circuit board (11) are coupled to the semiconductor chip (31) via wirebonds (35, 36).

14 Claims, 2 Drawing Sheets

SEMICONDUCTOR COMPONENT

BACKGROUND OF THE INVENTION

The present invention relates, in general, to semiconductor devices and, more particularly, to semiconductor device packages.

Semiconductor devices are encapsulated for protection from damage by external stresses and to provide a means for carrying electrical signals to and from the devices. Included in the repertoire of semiconductor device package types are dual-in-line packages, pin grid array packages, TAB packages, multichip modules, and power packages. An important class of power package are Radio Frequency (RF) power packages. These packages are typically used when the semiconductor die dissipates power greater than ten watts, and operates at frequencies greater than 100 megaHertz. Conventional RF power devices require complex assembly techniques that are not only expensive, but incompatible with the automated assembly techniques employed by end-users.

Accordingly, it would be advantageous to have a method for making RF power semiconductor packages that can be readily incorporated into an end-users manufacturing process. It would be of further advantage for the method to be cost efficient and to incorporate electrical components to facilitate impedance matching of the RF power device with the end-user's circuitry.

DETAILED DESCRIPTION OF THE DRAWINGS

Figure 1:
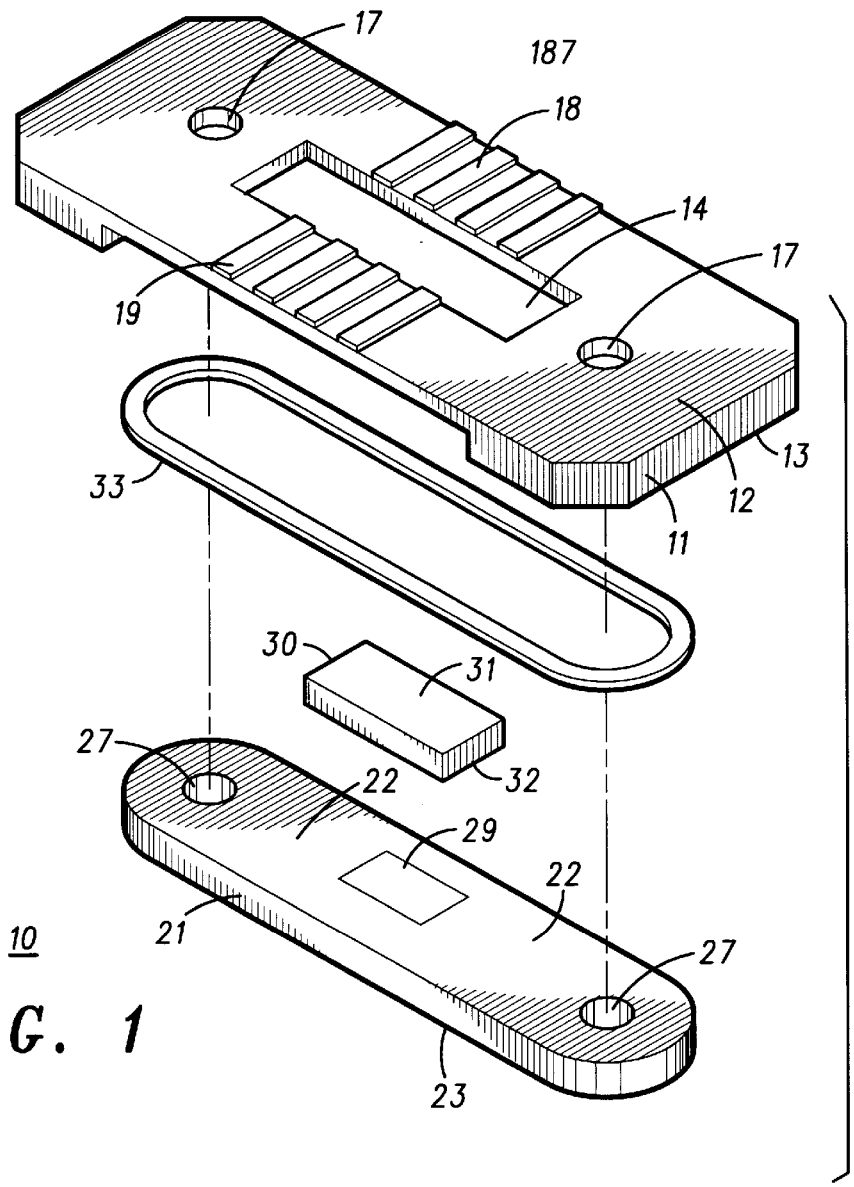
FIG. 1 is an exploded isometric view of a semiconductor component in accordance with an embodiment of the present invention.

FIG. 1 is an exploded isometric view of a semiconductor component 10 in accordance with an embodiment of the present invention. What is shown in FIG. 1 is a rectangularly shaped substrate 11 having surfaces 12 and 13. An opening 14 extends from surface 12 through substrate 11 to surface 13. Substrate 11 also has mounting holes 17 extending therethrough. Preferably, substrate 11 is a multi-layer structure such as, for example, a printed circuit board or an organic metal laminate. In accordance with the first embodiment, a plurality of electrodes or bonding strips 18 and 19 are formed on surface 12. Electrodes 18 and 19 are also referred to as electrical conductors. Although the plurality of electrodes 18 and 19 are shown as comprising four electrodes each, it should be understood this is not a limitation of the present invention. For instance, electrodes 18 and 19 may each be a single large electrodes, or the plurality of electrodes may be 2, 3, 5, or any number. In addition, the number of electrodes 18 may be different than the number of electrodes 19.

Semiconductor component 10 further includes a flange or heatsink 21 having surfaces 22 and 23 and fastening or mounting holes 27 that are concentric with holes 17 in substrate 11 after mating substrate 11 with flange 21. Fastening holes 27 may also be used to fasten flange 21 to any surface that is external to semiconductor component 10 such as, for example, end-user heatsinks, printed circuit boards, electrical chassis's, etc. Suitable materials for flange 11 include aluminum, copper, alloys of tungsten and copper, laminates of copper and molybdenum, alloys of copper and molybdenum, and a metal matrix composite such as for example, aluminum silicon carbide or copper and graphite fibers.

A die attach or adhesive material 29 is formed on a portion of surface 22 using, for example, a plating process. By way of example, die attach material 29 is comprised of a layer of nickel formed on surface 22 and a layer of gold formed on the nickel layer. The nickel layer may have a thickness ranging between approximately 1 micron and approximately 10 microns and the gold layer may have a thickness ranging between approximately 1 micron and approximately 5 microns. Typical thicknesses of the nickel and gold layers are approximately 3 microns and approximately 2.5 microns, respectively. Other suitable materials for die attach material 29 include, but are not limited to, a combination of gold and tin, wherein the tin is formed on a portion of surface 22 and the gold is formed on the tin; lead and tin, wherein the tin is formed on the portion of surface 22 and the lead is formed on the tin; and organic materials such as electrically conductive epoxy or silver filled glass.

A semiconductor chip or die 30 having surfaces 31 and 32 is bonded to surface 22 using techniques known to those skilled in the art.

Flange 21 is bonded to surface 13 of substrate 11 using, for example, a solder preform 33. It should be understood that after flange 21 has been bonded to substrate 11, semiconductor chip 31 is contained within or extends through opening 14. It should be further understood that the material or techniques used to bond flange 21 to substrate 11 are not limitations of the present invention. For example, a non-metallic adhesive material containing metallic particles may be used in place of solder preform 33.

Figure 2:
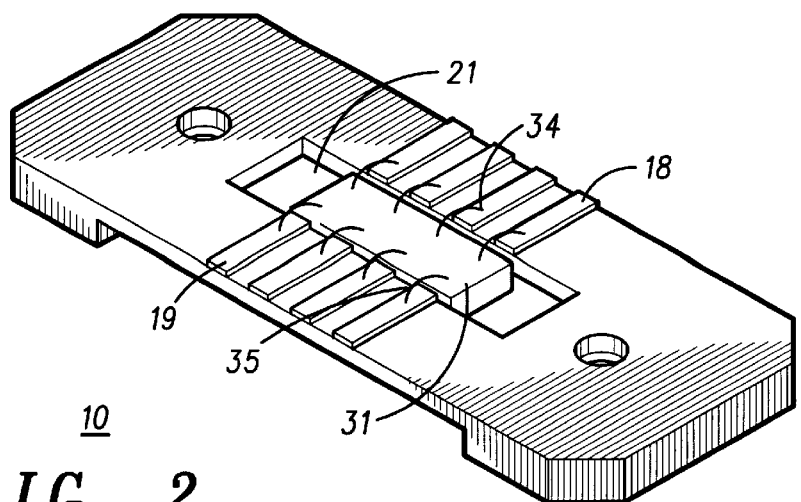
FIG. 2 is an isometric top view of the semiconductor component of FIG. 1.

FIG. 2 is an isometric top view of semiconductor component 10 after flange 21 has been bonded to substrate 11. It should be understood that the same reference numerals are used in the figures to denote the same elements.

Wirebonds 34 and 35 are formed between semiconductor chip 31 and conductors 18 and 19, respectfully. Techniques for forming wirebonds are well known to those skilled in the art. Other forms of interconnection can be used including wirebonding, ribbon bonding, etc.

Although not shown, a cap or lid may be bonded to substrate 11. The cap protects semiconductor chip 30 and wirebonds 34 and 35 from physical and environmental stresses. The cap may have a recessed portion to accommodate the wirebonds. Other techniques for protecting the semiconductor die can also be used, including, but not limited to plastic encapsulation such as, for example, overmolding and the use of glob tops.

Figure 3:
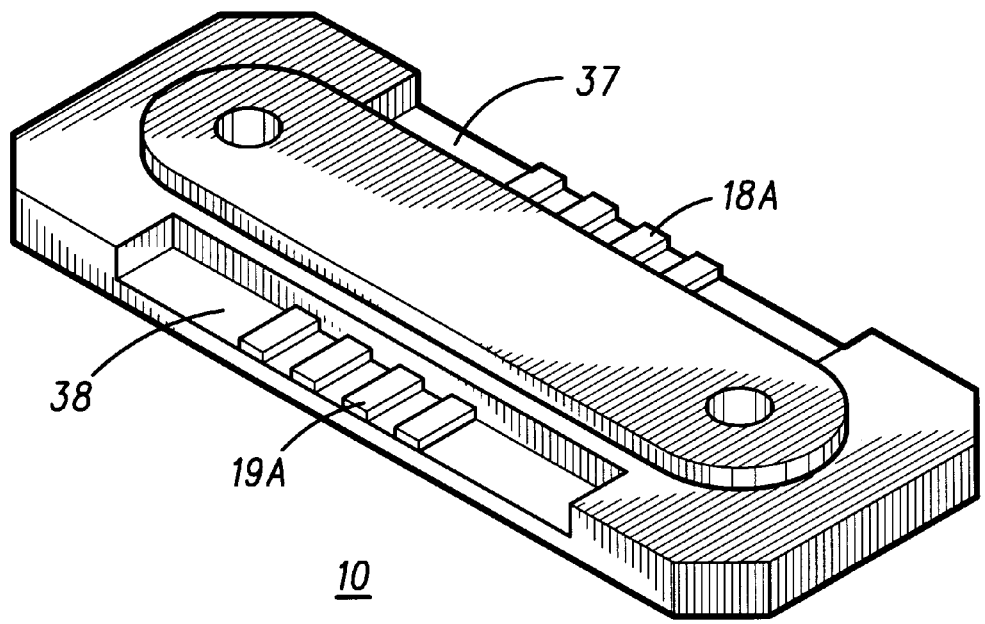
FIG. 3 is an isometric bottom view of the semiconductor component of FIG. 1.

FIG. 3 is an isometric bottom view of semiconductor component 10 after flange 21 has been bonded to substrate 11. In accordance with the embodiment shown in FIG. 3, substrate 11 has ledges 37 and 38 having a plurality of electrical conductors 18A and 19A, respectively, disposed thereon. Electrodes 18A and 19A are also referred to as electrical conductors. Electrodes 18A and 19A are electrically coupled to electrodes 18 and 19, respectively, via electrical interconnects (not shown) formed in substrate 11. Thus, electrodes 18A and 19A facilitate contacting the end-users circuitry. Although the plurality of electrodes 18A and 19A are shown as comprising four electrodes each, it should be understood this is not a limitation of the present invention. For instance, electrodes 18A and 19A may each be a single large electrode, or the plurality of electrodes may be 2, 3, 5, or any number. In addition, the number of electrodes 18A may be different from the number of electrodes 18, 19, and 19A.

Ledges 37 and 38, on the other hand, aid in mounting semiconductor component 10 to an electrical chassis, a heatsink, or the like. It should be understood that ledges 37 and 38 are optional features that may or may not be present. Further, ledges 37 and 38 may extend completely across substrate 11 such that substrate 11 has a "T" shape.

Figure 4:
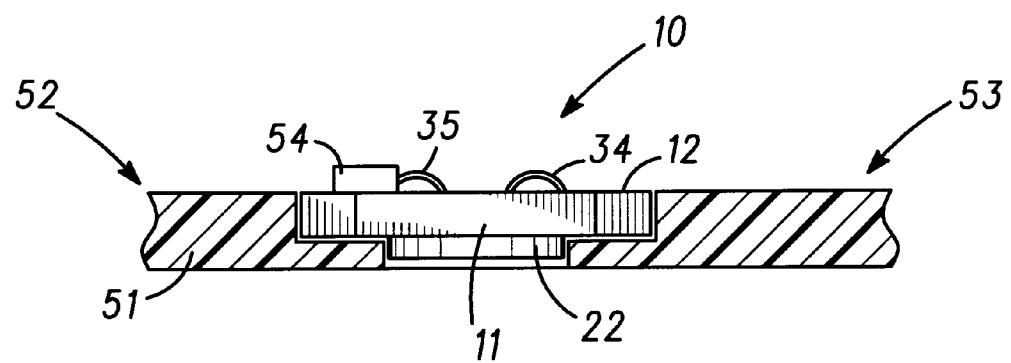
FIG. 4 is a cross-sectional view of a semiconductor component in accordance with the present invention.

FIG. 4 is an example of a cross-sectional view of a semiconductor component 10 mounted to an end-user or customer circuit board 51 having coupling ledges 52 and 53. It should be understood that this invention can be used in several different mounting configurations either on the top or the bottom of the customer circuit board. In addition, semiconductor component 10 can be mounted in an inverted or a noninverted configuration. A passive element 54 such as a capacitor, an inductive element, a resistor, or a transmission line is shown mounted to surface 12 of substrate 11. These elements can be mounted on or within substrate 11. Further, these elements simplify the designs for the end-user by providing a module for their use. Ledges 37 and 38 are placed on corresponding coupling ledges 52 and 53. In particular, electrodes 18A and 19A are bonded to electrodes or conductive traces (not shown) on circuit board 51. Electrodes 18A and 19A may be soldered, staked, welded, etc. to the corresponding conductive traces on the circuit board. It should be apparent that semiconductor component 10 allows better impedance matching of the elements on semiconductor component 10 than conventional packaging techniques because stubs and the number of parasitic elements are reduced.

By now it should be appreciated that an RF semiconductor component has been provided that is easily manufacturable and integrable in an end-user's manufacturing process. An advantage of the present invention is that electrically passive circuit elements or other functional circuitry may be formed on the surface or within the substrate of the semiconductor component such that this circuitry is properly impedance matched to the end-user's circuitry. Further, the range of material choices is such as to allow reliable coupling of all components using commonly available coupling materials and processes.

What is claimed is:

1. A semiconductor component, comprising:
    a substrate having first and second major surfaces and an opening extending from the first major surface through the substrate to the second major surface;
    a flange having first and second major surfaces and a semiconductor chip coupled to a first portion of the first major surface, wherein the first major surface of the flange is mated with the second major surface of the substrate such that the semiconductor chip is inserted through the opening;
    a die attach material disposed on a first portion of the first major surface of the flange; and
    a semiconductor chip coupled to the first portion of the first major surface, wherein the semiconductor chip is bonded to the first portion of the first major surface using an electrically and thermally conductive bond.

2. The semiconductor component of claim 1, wherein the flange is made from a material selected from the group of aluminum, copper, alloys of tungsten and copper, laminates of copper and molybdenum, alloys of copper and molybdenum, copper graphite, and metal matrix composite materials.

3. The semiconductor component of claim 1, wherein the substrate is an organic metal laminate.

4. The semiconductor component of claim 1, further including a passive element coupled to the first major surface of the substrate.

5. A semiconductor component, comprising:
    a substrate having first and second major surfaces and an opening extending from the first major surface through the substrate to the second major surface;
    a flange having first and second major surfaces and a semiconductor chip coupled to a first portion of the first major surface, wherein the first major surface of the flange is mated with the second major surface of the substrate such that the semiconductor chip is inserted through the opening; and
    a passive element coupled to the second major surface of the substrate.

6. The semiconductor component of claim 5, wherein the passive element is selected from the group consisting of a capacitor, an inductor, a resistor, and a transmission line.

7. A semiconductor component, comprising:
    a substrate having first and second major surfaces and an opening extending from the first major surface through the substrate to the second major surface, wherein the substrate comprises first and second layers, the first layer comprised of an electrically conductive material and the second layer comprised of an electrically nonconductive material;
    a flange having first and second major surfaces and a semiconductor chip coupled to a first portion of the first major surface, wherein the first major surface of the flange is mated with the second major surface of the substrate such that the semiconductor chip is inserted through the opening.

8. The semiconductor component of claim 7, wherein the substrate further includes a third layer which is comprised of an electrically conductive material and wherein the second layer is sandwiched between the first and third layers.

9. The semiconductor component of claim 7, wherein the substrate further includes a mounting structure.

10. The semiconductor device of claim 5, wherein the flange is made from a material selected from the group of aluminum, copper, alloys of tungsten and copper, laminates of copper and molybdenum, alloys of copper and molybdenum, and a metal matrix composite.

11. The semiconductor device of claim 5, wherein the substrate comprises a laminated structure, and wherein at least one of the laminated layers is a layer of metal and at least one of the laminated layers is an insulating layer.

12. The semiconductor device of claim 11, wherein the substrate further includes at least one conductive strip disposed on the insulating layer.

13. The semiconductor device of claim 12, further including wirebonds coupling the semiconductor chip to the at least one conductive strip.

14. The semiconductor device of claim 7, wherein the substrate contains electrically passive components on the first major surface or within the substrate.

* * * * *